(12) United States Patent
Aromin et al.

(10) Patent No.: US 11,979,016 B1
(45) Date of Patent: *May 7, 2024

(54) LCDI POWER CORD CIRCUIT HAVING A POWER CORD FAULT CIRCUIT FOR MONITORING A NEUTRAL WIRE SHIELD AND A LINE WIRE SHIELD INTEGRITY

(71) Applicant: Tower Manufacturing Corp., Providence, RI (US)

(72) Inventors: Victor V Aromin, West Warwick, RI (US); Louis J. Shatkin, Warwick, RI (US)

(73) Assignee: Tower Manufacturing Corp., Providence, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/168,341

(22) Filed: Feb. 13, 2023

(51) Int. Cl.
| | | |
|---|---|---|
| *H02H 3/16* | (2006.01) | |
| *G01R 31/08* | (2020.01) | |
| *G01R 31/52* | (2020.01) | |
| *H01H 83/02* | (2006.01) | |

(52) U.S. Cl.
CPC ........... *H02H 3/162* (2013.01); *G01R 31/086* (2013.01); *G01R 31/52* (2020.01); *H01H 83/02* (2013.01)

(58) Field of Classification Search
CPC ...... G01R 31/086; G01R 31/52; G01R 31/54; G01R 31/58; H01H 83/02; H02H 1/0007; H02H 3/16; H02H 3/162; H02H 5/10
See application file for complete search history.

(56) References Cited

U.S. PATENT DOCUMENTS

| | | |
|---|---|---|
| 4,918,977 A | 4/1990 | Takahaski et al. |
| 5,517,165 A | 5/1996 | Cook |
| 6,144,209 A | 12/2000 | Raymond et al. |
| 6,218,647 B1 | 4/2001 | Jones |
| 7,307,211 B1 | 12/2007 | Caccia |
| 7,492,558 B2 | 2/2009 | Germain et al. |
| 8,384,502 B2 | 2/2013 | Gao |
| 8,587,914 B2 | 11/2013 | Kamor et al. |
| 8,659,857 B2 | 2/2014 | Gandolfi |
| 8,760,824 B2 | 6/2014 | Armstrong |
| 9,312,680 B2 | 4/2016 | Li et al. |
| 9,450,395 B2 | 9/2016 | Aromin et al. |
| 9,478,382 B1 | 10/2016 | Aromin |
| 9,608,433 B2 | 3/2017 | Simonin |
| 9,966,165 B2 | 5/2018 | Gross et al. |
| 10,001,526 B2 | 6/2018 | Salas |
| 10,020,649 B2 | 7/2018 | Du |
| 10,984,923 B2 | 4/2021 | Aromin et al. |
| 11,049,632 B2 * | 6/2021 | Aromin ................. H01B 1/023 |
| 11,381,070 B1 * | 7/2022 | Legatti ................... G01R 31/52 |
| 2005/0243485 A1 | 11/2005 | Gershen et al. |
| 2011/0209894 A1 | 9/2011 | Williams et al. |
| 2018/0017611 A1 | 1/2018 | Radun et al. |
| 2018/0337530 A1 | 11/2018 | Gariboldi et al. |
| 2021/0027915 A1 * | 1/2021 | Aromin ................. G01R 31/52 |

(Continued)

*Primary Examiner* — Jared Fureman
*Assistant Examiner* — Nicolas Bellido (57) ABSTRACT

A LCDI power cord circuit is provided. The circuit includes energizing shielded wires and monitoring the energized shields for surges, e.g., arcing, and/or voltage drops, e.g., shield breaks detected by a Power Cord Fault Circuit (PCFC). The PCFC includes one dual purpose amplifying/switch transistor and the LCDI power cord circuit does not include any discrete capacitive components.

8 Claims, 10 Drawing Sheets

(56) References Cited

U.S. PATENT DOCUMENTS

| | | | |
|---|---|---|---|
| 2021/0125753 A1* | 4/2021 | Aromin | H01B 13/22 |
| 2021/0125754 A1* | 4/2021 | Aromin | H02H 3/16 |
| 2023/0268730 A1* | 8/2023 | Li | H02H 3/32 |
| | | | 361/87 |

* cited by examiner

FIG. 9

LCDI POWER CORD CIRCUIT HAVING A POWER CORD FAULT CIRCUIT FOR MONITORING A NEUTRAL WIRE SHIELD AND A LINE WIRE SHIELD INTEGRITY

BACKGROUND

1. Field of Use

This invention relates to leakage current detection and interruption (LCDI) power cord circuits for detecting a leakage current and open or faulty shields in a power cord.

2. Description of Prior Art (Background)

With the wide use of household electrical appliances, such as air conditioners, washing machines, refrigerators, etc., more attention is being paid to the safety of using such appliances. An appliance typically has a power cord of one meter or longer.

Power cords may age due to long-term use, or become damaged when the appliance is moved, which may cause a current leakage between the phase line and the neutral or ground lines in the cord. Such leakage current may cause sparks, which may cause fire and property damages. To quickly and accurately detect leakage current in the power cord, an additional conductor is often provided and electrically connected to a metal sheath surrounding the phase line and the neutral line. Leakage current can be detected by detecting a voltage on the metal sheath. The metal sheaths are conventionally made by weaving thin copper wires.

Further, the metal sheath can fail due to failure in structural integrity or corrosion. Failure of the metal sheath to provide continuity between the power cord source and the power cord load may allow leakage current to not be detected by an ordinary LCDI circuit.

Prior art solutions often provide a circuit for detecting an open metal, i.e., failed structural integrity and a separate circuit for detecting leakage current. Multiple circuits require more components, increased footprint, and longer production cycles. Therefore, a need exists for a single circuit for detecting leakage current, metal sheath structural integrity, and metal sheath corrosion that could interfere with leakage current detection.

BRIEF SUMMARY

Accordingly, the present invention provides a power cord circuit useful for appliances such as air conditioners, washing machines, refrigerators, etc.

In accordance with one embodiment of the present invention a Leakage Current Detection Interrupter (LCDI) circuit for interrupting AC power from an AC source connected to a load via an insulated neutral wire surrounded by a neutral wire shield (NWS) and an insulated line wire surrounded by a line wire shield (LWS) is provided. The LCDI circuit includes a power supply circuit for supplying a rectified voltage waveform and a floating load connected to the power supply circuit. The floating load includes a power cord fault circuit (PCFC) for monitoring the NWS and LWS integrity and leakage current. The LCDI does not include any discrete capacitors as in other prior art solutions, thereby reducing cost, footprint, and production times.

The invention is also directed towards an A Leakage Current Detection Interrupter (LCDI) circuit for interrupting AC power from an AC source connected to a load via an insulated neutral wire and an insulated line wire, wherein the insulated neutral wire and an insulated line wire are surrounded by a conductive shield (CS). The LCDI circuit includes a power supply circuit for supplying a rectified voltage waveform and a floating load connected to the power supply circuit. The floating load includes a power cord fault circuit (PCFC) for monitoring the CS integrity and detecting leakage current. The PCFC includes a solid-state amplifier (SSA) connectable to the CS; a bi-stable latching device having on/off states. The SSA connected to the bi-stable latching device being selectively turned on and off based upon sufficient application of a portion of the rectified signal positive pulse to a base of the SSA. The LCDI does not include any discrete capacitors as in other prior art solutions, thereby reducing cost, footprint, and production times.

In accordance with another embodiment of the present invention a power cord circuit comprising a floating load is presented. The floating load includes a power cord fault circuit (PCFC) for monitoring power cord integrity and detecting leakage current. The PCFC includes a solid-state amplifier (SSA) connectable to a conductive shield (CS). The bi-stable latching device having on/off states and wherein the SSA connected to the bi-stable latching device being selectively turned on or off based upon application of a portion of a rectified signal positive pulse to a base of the SSA. The PCFC does not include any discrete capacitors as in other prior art solutions, thereby reducing cost, footprint, and production times.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Figure 1:
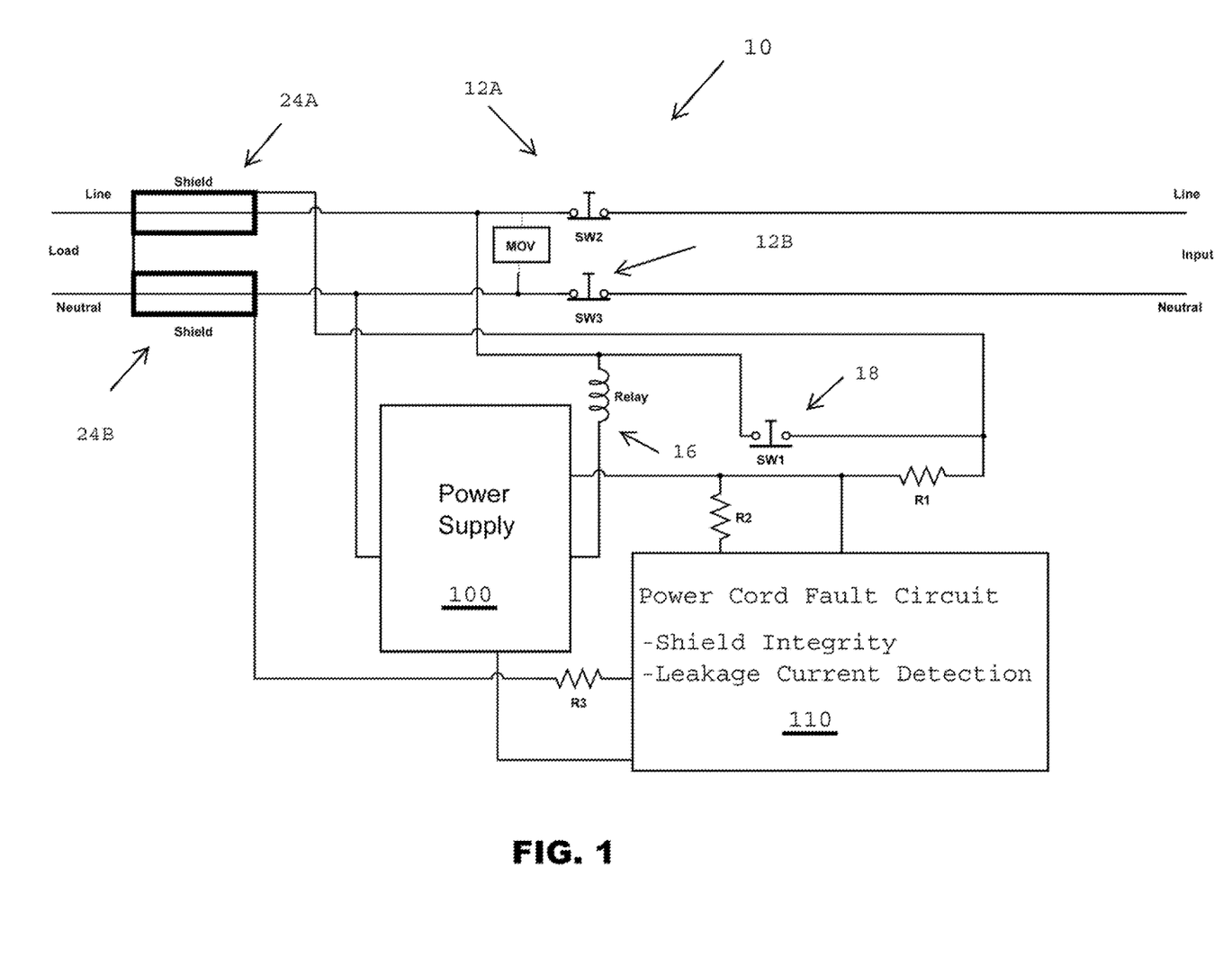
FIG. 1 is a circuit block diagram of the LCDI Power Cord Circuit in accordance with the present invention.

Referring to FIG. 1 there is shown a circuit block diagram of a LCDI POWER CORD CIRCUIT 10 (LCDI). LCDI circuit 10 includes Line Wire Shield (LWS) 24A and Neutral Wire Shield (NWS) 24B, switch 18, power supply circuit 100, power cord fault circuit (PCFC) 110, relay 16; and, manually engaged ganged switches 12A, 12B, hereinafter referred to as the manual reset switch. As shown herein the PCFC comprises a floating load with respect to the power supply 100.

As is described herein, when manual reset switches 12, 12A are set line voltage is connected to LOAD and to power supply circuit 10 via relay 16. Power supply circuit 100 supplies bias voltages to PCFC 110, and shields 24A and 24B. Shields 24A and 24B are connected in series at the Load end, are connected in series between power supply 100 and PCFC 110. As is discussed and shown in more detail herein, the PCFC 110 allows a small amount of relay current to flow through relay 16 but less than the energizing current needed to energize relay 16 to disengage manual reset switches 12A,12B. It is appreciated that not starting from zero energizing current allows solenoid 519 to energize faster when a fault is detected.

Figure 1A:
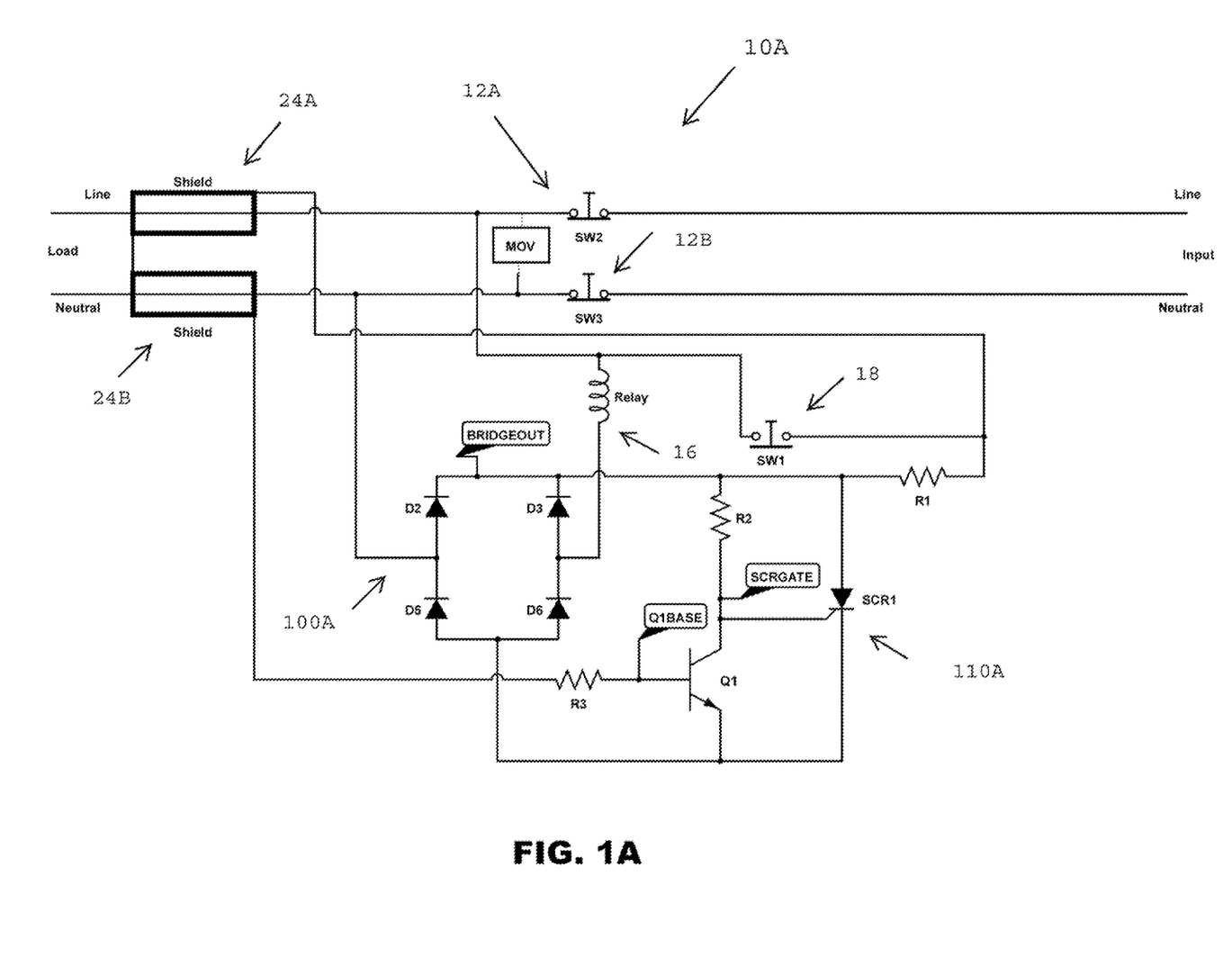
FIG. 1A is a detailed schematic diagram of the block diagram shown in FIG. 1.

Referring also to FIG. 1A there is shown a detailed circuit 10A of the block diagram 10 shown in FIG. 2. LCDI circuit 10A includes Line Wire Shield (LWS) 24A and Neutral Wire Shield (NWS) 24B, switch 18, power supply circuit 100A, and PCFC 110A. Line Wire Shield (LWS) 24A and Neutral Wire Shield (NWS) 24B may be any suitable conductive shield surrounding the line and neutral wires as discussed in more detail herein. As is described in more detail herein, when manual reset switches 12, 12A are set line voltage is connected to LOAD and to power supply circuit 100A via relay 16. Power supply circuit 100A supplies bias voltages to PCFC 110A, and shields 24A and 24B. As is discussed and shown in more detail herein, the PCFC 110 allows a small amount of relay current to flow through relay 16 but less than the energizing current needed to energize relay 16 to disengage manual reset switches 12, 12A. It is appreciated that not starting from zero energizing current allows relay 519 to energize faster when a fault is detected.

Figure 2:
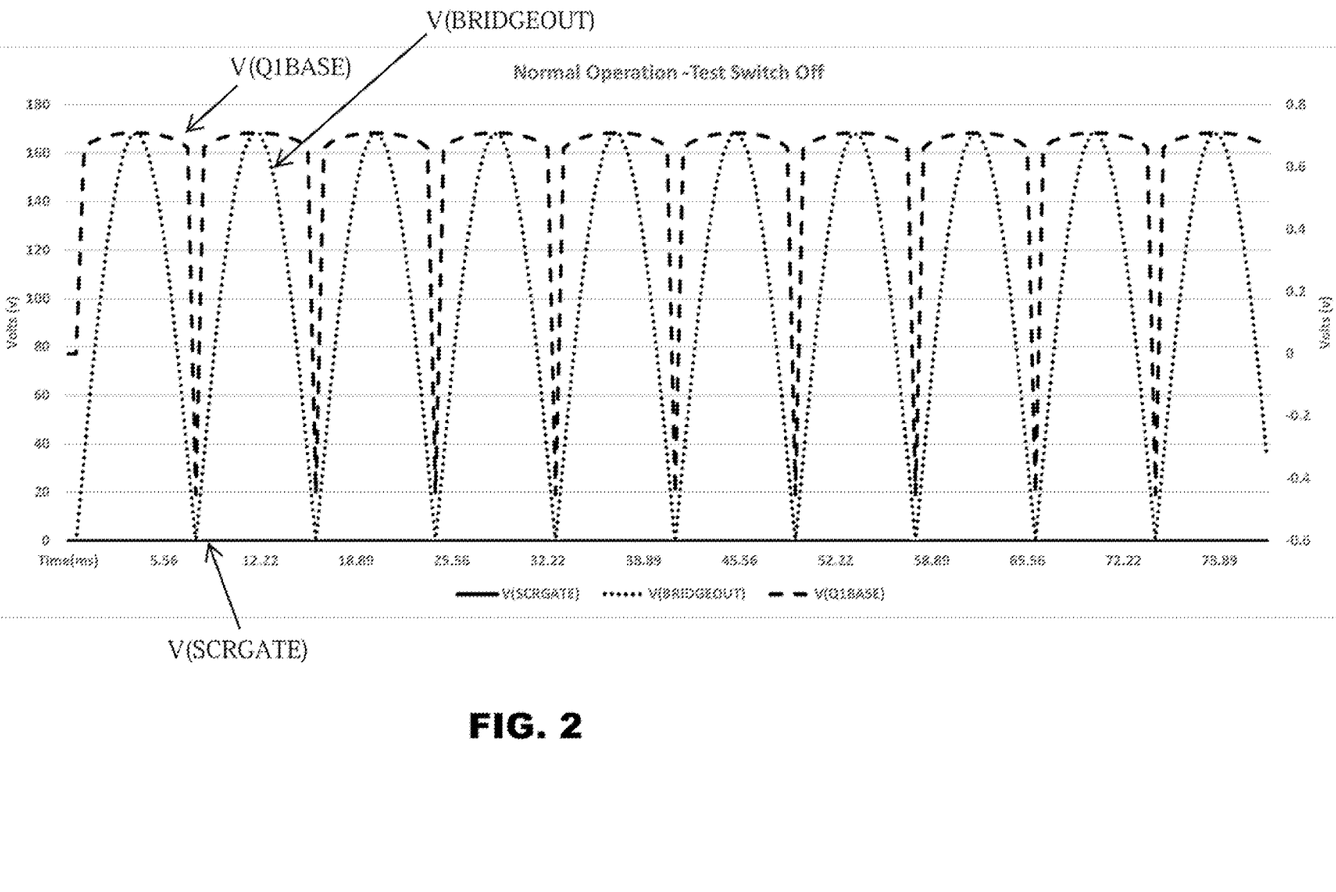
FIG. 2 is a waveform diagram for the normal operating condition of the Power Cord Circuit shown in FIGS. 1, 1A.
Figure 3:
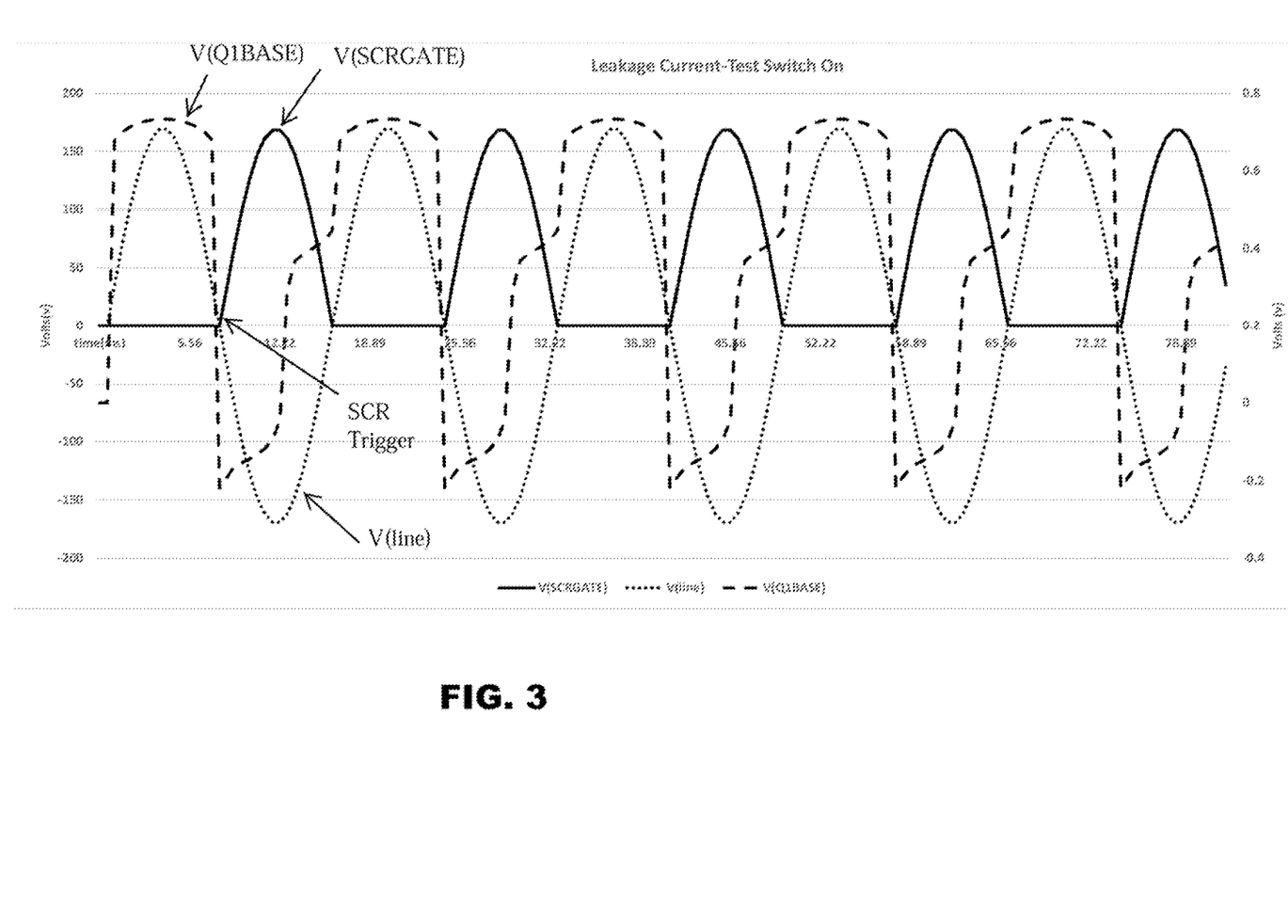
FIG. 3 is a waveform diagram for the leakage current detection condition of the Power Cord Circuit shown in FIGS. 1, 1A.

Referring now to FIG. 1A and FIG. 2. When switches 12, 12A are mechanically (manually) engaged AC line voltage is connect to LOAD. 60 Hz AC line voltage is also connected to power supply circuit 110A via relay 16. Power supply circuit 110A, comprising bridge rectifier (diodes D1-D4) outputs a rectified unsmoothed DC signal at BRIDGEOUT. The rectified unsmoothed DC signal at BRIDGEOUT is routed through R1 to Q1 base via shields 24A, 24B. The rectified unsmoothed DC signal at BRIDGEOUT is also routed through R2 to Q1 collector and SCR1 gate.

Still referring to FIG. 1A and FIG. 2, the rectified unsmoothed DC signal at BRIDGEOUT is routed to the base of npn transistor Q1, R1 and R3 biasing Q1 into an on condition during the positive cycle of the rectified unsmoothed DC, dropping the rectified voltage across R2. When Q1(B) voltage drops below $V_{BE}$ Q1 turns off and the voltage at Q1(C) is near 0v due to the unsmoothed DC signal at BRIDGEOUT dropping to near 0v in the cycle. When the unsmoothed DC signal at BRIDGEOUT swings positive, Q1 is again biased on, dropping the unsmoothed DC signal at BRIDGEOUT across R2, keeping SCR1 in an off condition during normal operation.

Still referring to FIG. 1A, it is understood that under normal conditions the rectified unsmoothed DC signal at BRIDGEOUT is dropped across resistor R2 and that R2 is sized to allow an amount of AC current less than the relay 16 energizing current to flow through R2 through Q1 back to neutral when Q1 is conducting. During Q1's off state, or non-conducting state, relay 16 inductively opposes the change in current until Q1 again turns on, thus maintaining, or nearly maintaining the current flow through relay 16. It is understood and appreciated that the small amount of relay current flowing through relay 16 is less than the energizing current needed to energize relay 16 to disengage manual reset switches 12,12A. It is further appreciated that not starting from zero energizing current allows relay 16 to energize faster when a fault is detected.

Figure 4:
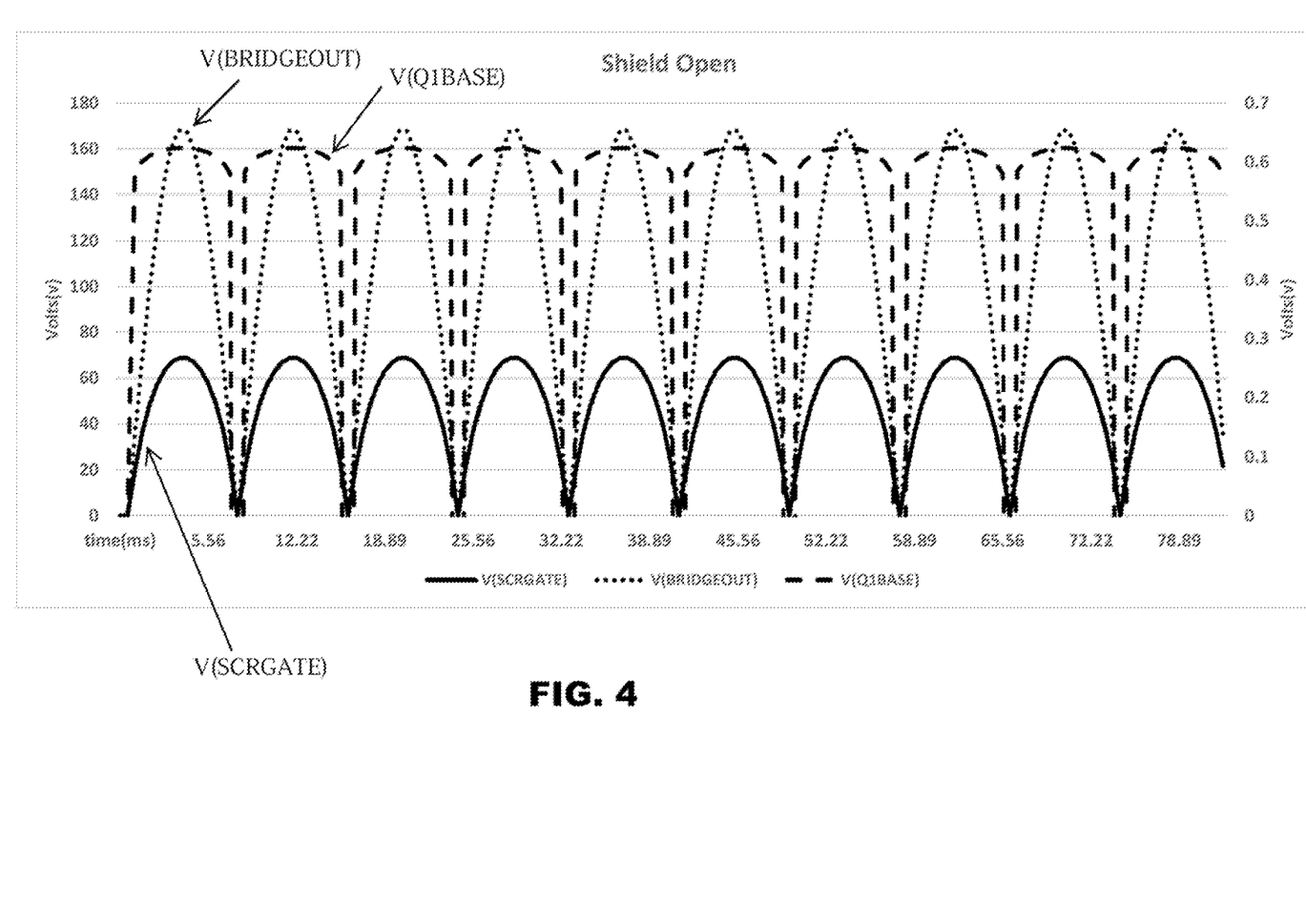
FIG. 4 is a waveform diagram for the shield open or degraded detection condition of the Power Cord Circuit shown in FIGS. 1, 1A.

Still referring to FIG. 1A and now FIG. 4, when either of the shields 24A or 24B integrity is compromised, such as, for example, a break in either shield, or a voltage drop across areas of corrosion within the power cable, the bias-on voltage $V_{BE}$ at the base of Q1 is insufficient to keep Q1 in its full conductive state. The voltage at the Q1 collector (V(SCRGATE)) begins to rise on the first positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect and disconnect the AC line source from the load when a fault is detected during the positive or negative cycle of an input AC waveform (not shown). In other words, the PCFC 110A detects and interrupts power between the AC line source and load within approximately 1 ms or less for a 60 Hz AC source.

Still referring to FIG. 1A and FIG. 4, when either of the shields 24A or 24B integrity is compromised, such as, for example, a leakage current, the bias-on voltage $V_{BE}$ at the base of Q1 is insufficient to keep Q1 in its full conductive state. The voltage at the Q1 collector (V(SCRGATE)) begins to rise on the second positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect leakage current and disconnect the AC line source from the load when a fault is detected during the negative cycle of an input AC waveform (not shown). In other words, the PCFC 110A detects and interrupts power between the AC line source and load within approximately 17 ms. or less for a 60 Hz AC source.

Figure 5:
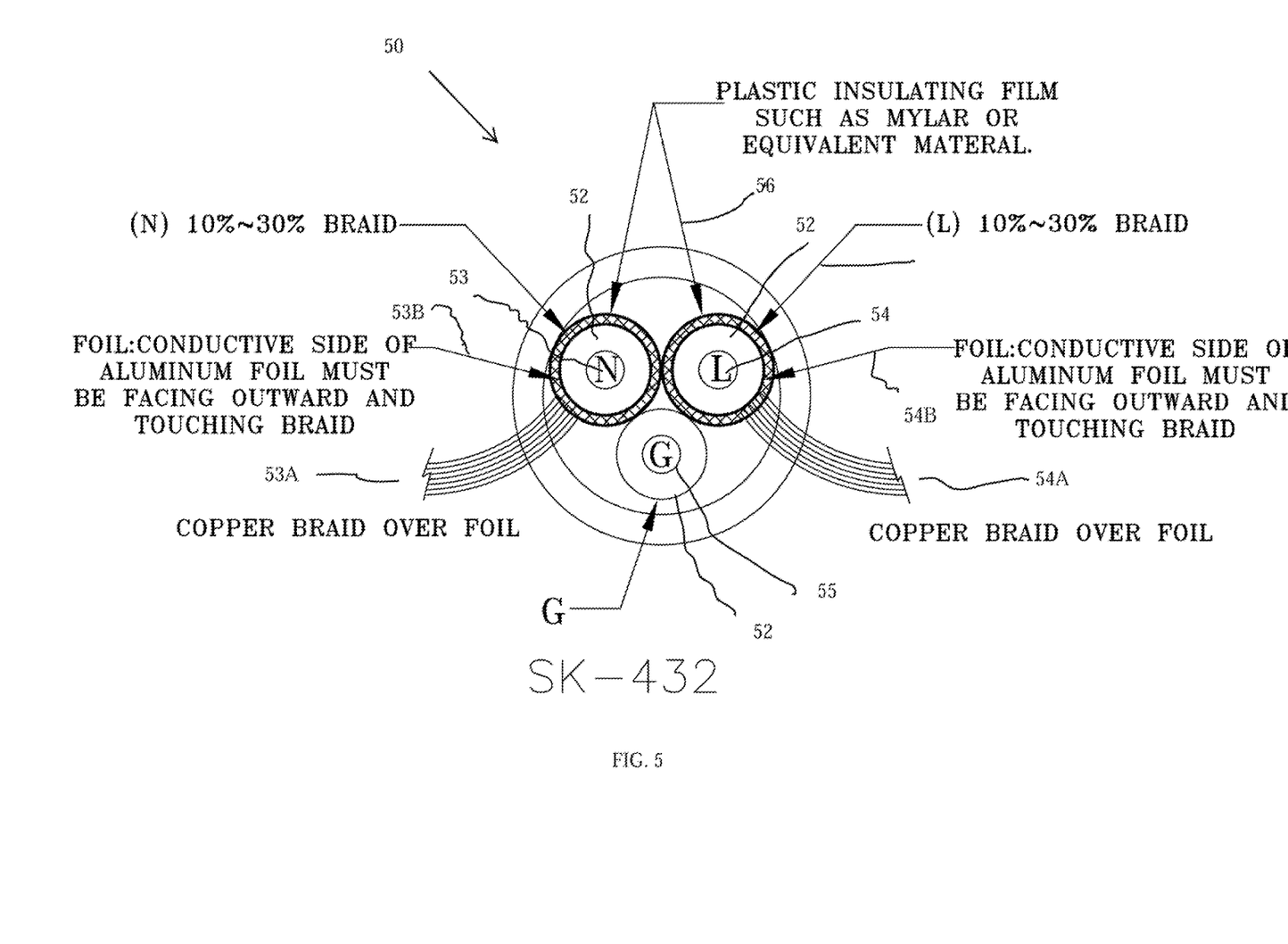
FIG. 5 is a diagram of the Line Wire Shield (LWS) and Neutral Wire Shield (NWS) shown in FIG. 1.

Referring now to FIG. 5 there is shown a diagram of Power Cord 50 including Line Wire Shield (LWS) 24A and Neutral Wire Shield (NWS) 24B shown in FIG. 1 and FIG.

1A. Power Cord 50 includes neutral wire 53, line wire 54, and ground wire 55. Neutral wire 53, line wire 54, and ground wire 55 are each surrounded by an insulator 52. The LWS 24A includes a conductive foil 54B, a conductive braid 54A surrounding the conductive foil 54B, and an electrical insulating film 56 surrounding the conductive foil 54B and the conductive braid 54A. The electrical insulating film 56 may be any suitable insulating film such as a polyester film made from stretched polyethylene terephthalate (PET). The NWS 24B includes a conductive foil 53B, a conductive braid 53A surrounding the conductive foil 53B, and an electrical insulating film 56 surrounding the conductive foil 53B and the conductive braid 53A. The electrical insulating film 56 may be any suitable insulating film such as a polyester film made from stretched polyethylene terephthalate (PET).

Figure 6:
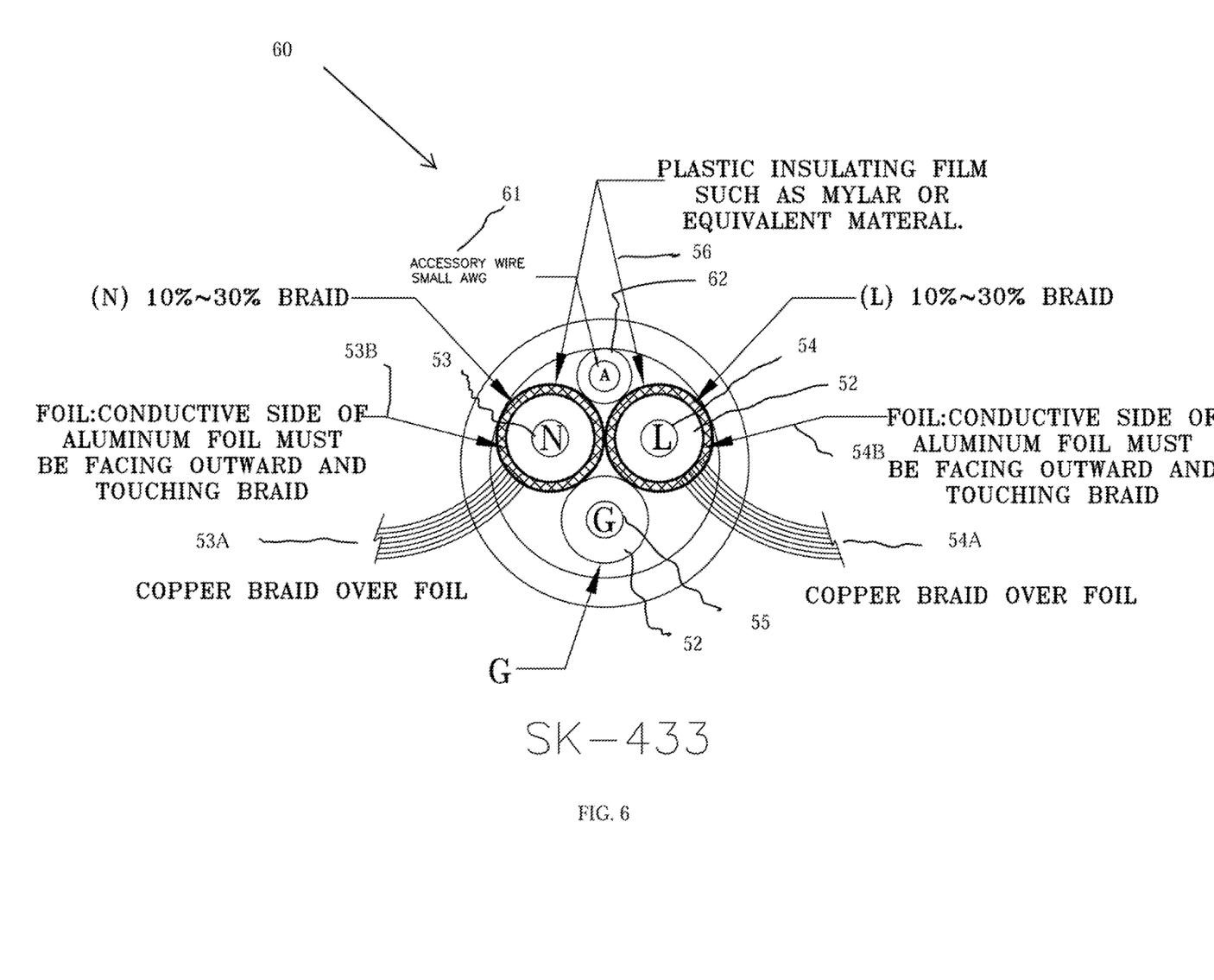
FIG. 6 is a diagram of an alternate embodiment of the Line Wire Shield (LWS) and Neutral Wire Shield (NWS) shown in FIG. 5.

Referring now to FIG. 6 there is shown an alternate embodiment 60 of the Power Cord 50 including Line Wire Shield (LWS) 24A and Neutral Wire Shield (NWS) 24B shown in FIG. 1A. Power Cord 60 includes neutral wire 53, line wire 54, and ground wire 55. Neutral wire 53, line wire 54, and ground wire 55 are each surrounded by an insulator 52. The LWS 24A includes a conductive foil 54B, a conductive braid 54A surrounding the conductive foil 54B, and an electrical insulating film 56 surrounding the conductive foil 54B and the conductive braid 54A. The electrical insulating film 56 may be any suitable insulating film such as a polyester film made from stretched polyethylene terephthalate (PET). The NWS 24B includes a conductive foil 53B, a conductive braid 53A surrounding the conductive foil 53B, and an electrical insulating film 56 surrounding the conductive foil 53B and the conductive braid 53A. The electrical insulating film 56 may be any suitable insulating film such as a polyester film made from stretched polyethylene terephthalate (PET). Power cord 60 also includes accessory wire 61 surrounded by insulation 62.

Figure 7:
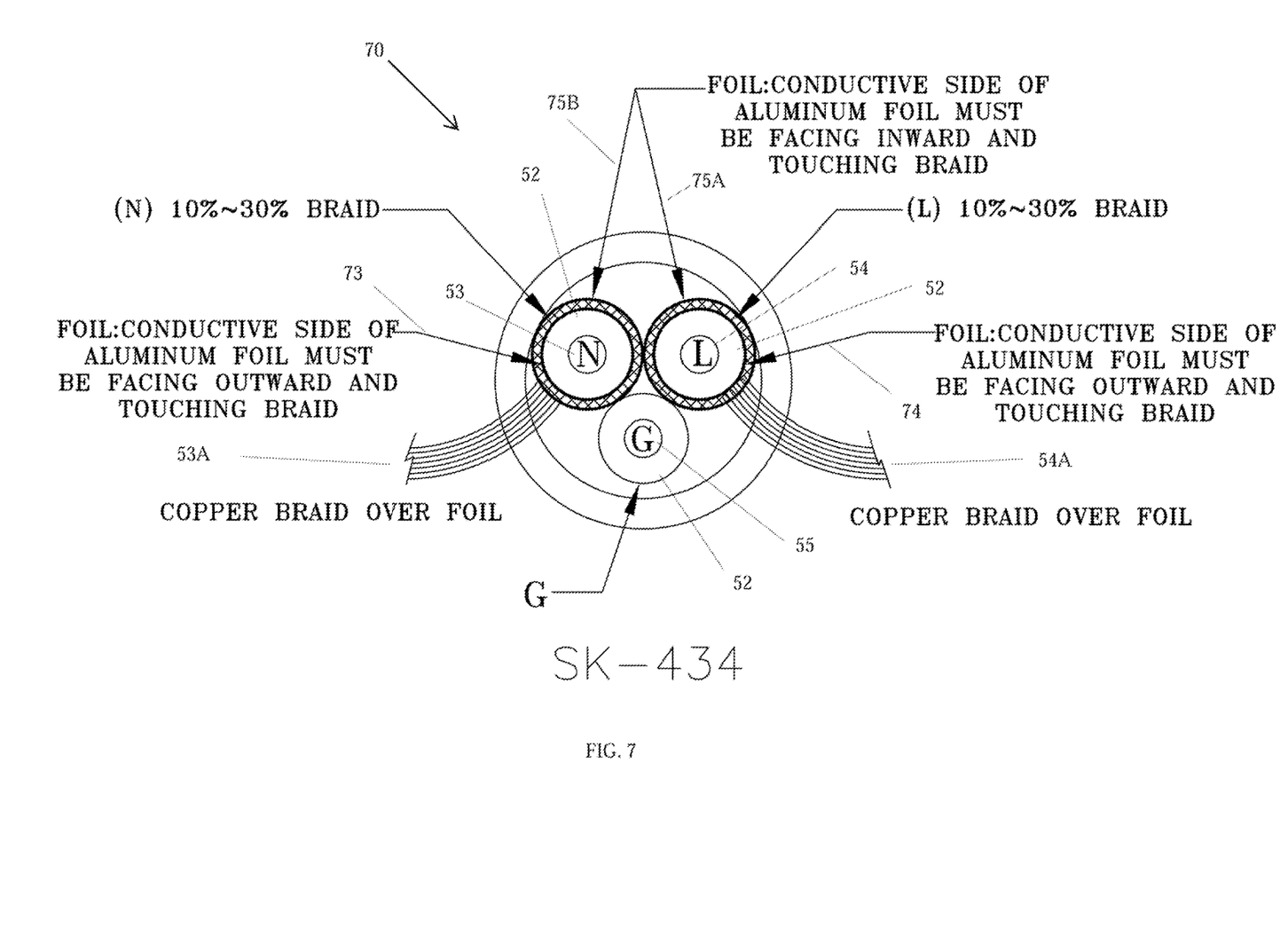
FIG. 7 is a diagram of an alternate embodiment of the Line Wire Shield (LWS) and Neutral Wire Shield (NWS) shown in FIG. 5.

Referring now to FIG. 7 there is shown an alternate embodiment 70 of the Power Cord 50 including Line Wire Shield (LWS) 24A and Neutral Wire Shield (NWS) 24B shown in FIG. 1A. Power Cord 70 includes neutral wire 53, line wire 54, and ground wire 55. Neutral wire 53, line wire 54, and ground wire 55 are each surrounded by an insulator 52. The LWS 24A includes wire 54, an insulator 52 surrounding wire 54, conductive foil 74, a conductive braid 54A sandwiched between the conductive foil 74 and insulator 52. The conductive foil 74 further includes a conductive side and a non-conductive side. The conductive side of conductive foil 74 faces outward and is in electrical contact with the conductive braid 54A. The NWS 24B includes wire 53, an insulator 52 surrounding wire 53, conductive foil 73, a conductive braid 53A sandwiched between the conductive foil 73 and insulator 52. The conductive foil 73 further includes a conductive side and a non-conductive side. The conductive side of conductive foil 73 faces outward and is in electrical contact with the conductive braid 53A. Each of the LWS and NWS are surrounded by a conductive foil 75. The conductive foil 75 further includes a conductive side and a non-conductive side. The conductive side of conductive foil 75A and 75B faces inward and is in electrical contact with the conductive braids 53A and 54A, respectively.

Figure 8:
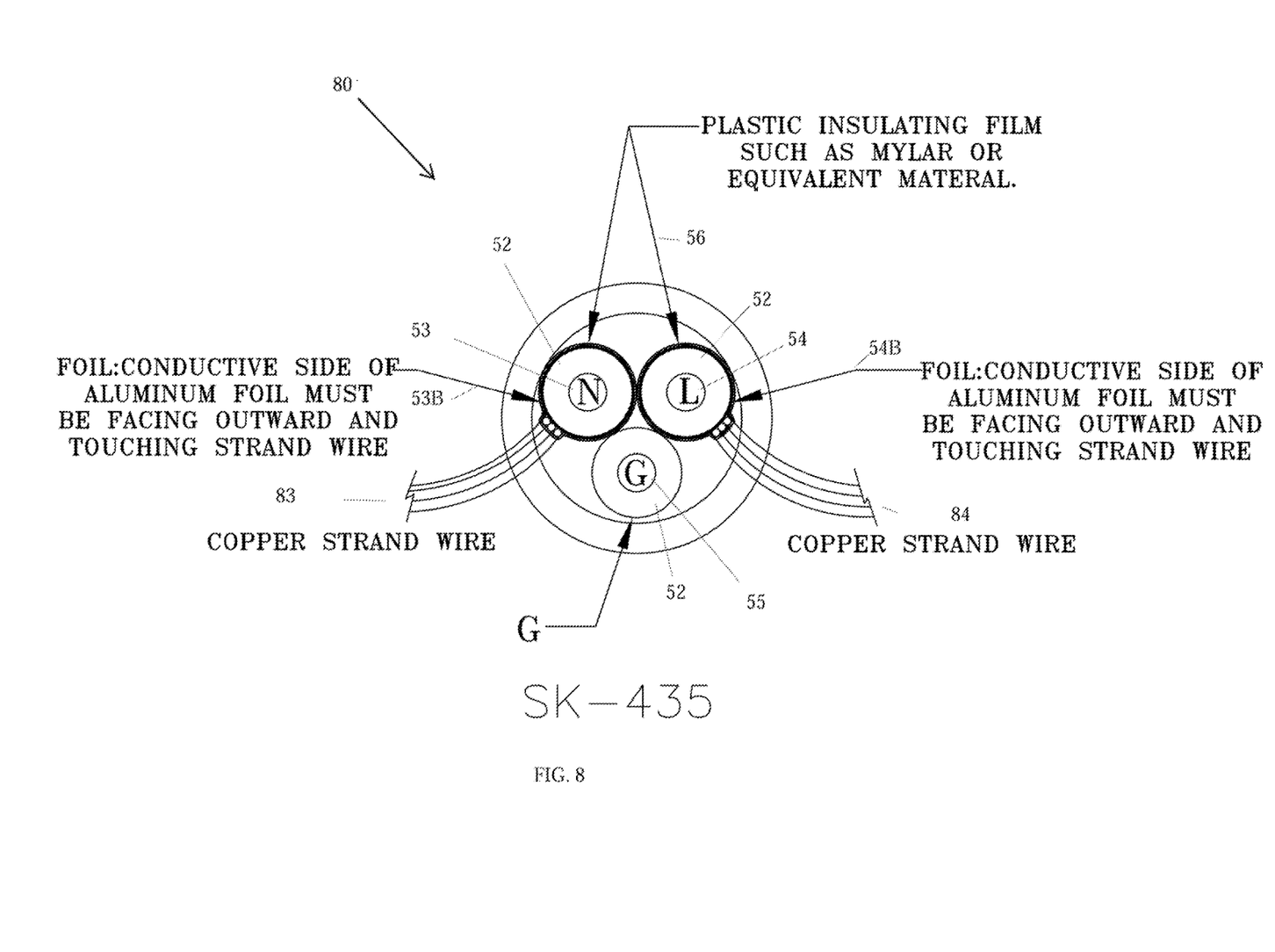
FIG. 8 is a diagram of an alternate embodiment of the Line Wire Shield (LWS) and Neutral Wire Shield (NWS) shown in FIG. 5.

Referring now to FIG. 8 there is shown an alternate embodiment 80 of the Power Cord 50 including Line Wire Shield (LWS) 24A and Neutral Wire Shield (NWS) 24B shown in FIG. 1A. Power Cord 80 includes neutral wire 53, line wire 54, and ground wire 55. Neutral wire 53, line wire 54, and ground wire 55 are each surrounded by an insulator 52. The LWS 24A includes a conductive foil 54B surrounding the insulated line wire 54, at least one copper strand wire 84 in electrical contact with the conductive foil 54B, and an electrical insulating film 56 surrounding the conductive foil 54B and the least one copper strand wire 84. The electrical insulating film 56 may be any suitable insulating film such as a polyester film made from stretched polyethylene terephthalate (PET). The NWS 24B includes a conductive foil 53B surrounding the insulated neutral wire 53, at least one copper strand wire 83 in electrical contact with the conductive foil 53B, and an electrical insulating film 56 surrounding the conductive foil 53B and the least one copper strand wire 83. The electrical insulating film 56 may be any suitable insulating film such as a polyester film made from stretched polyethylene terephthalate (PET).

Figure 9:
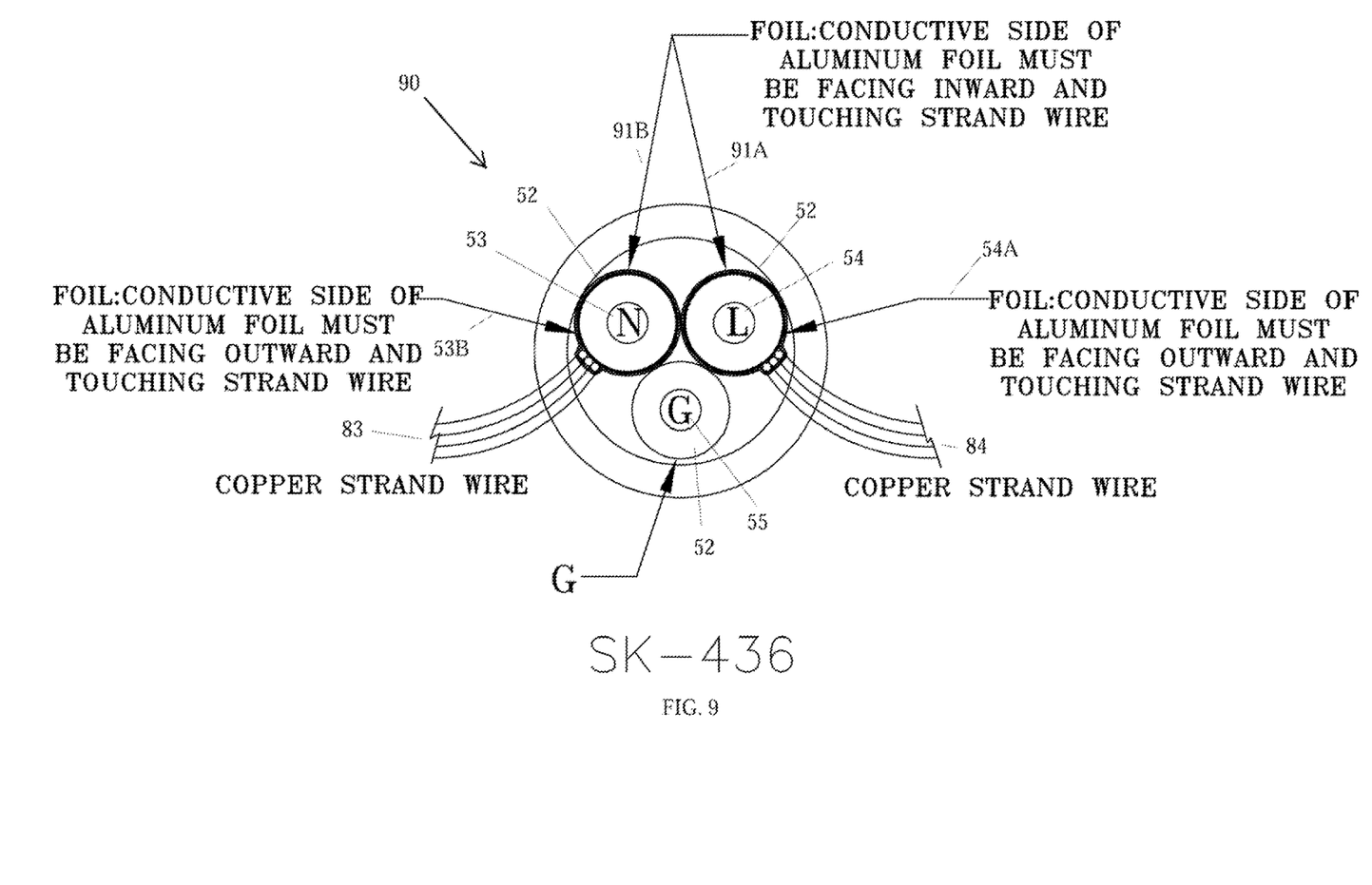
FIG. 9 is a diagram of an alternate embodiment of the Line Wire Shield (LWS) and Neutral Wire Shield (NWS) shown in FIG. 5.

Referring now to FIG. 9 there is shown an alternate embodiment 90 of the Power Cord 50 including Line Wire Shield (LWS) 24A and Neutral Wire Shield (NWS) 24B shown in FIG. 1A. Power Cord 90 includes neutral wire 53, line wire 54, and ground wire 55. Neutral wire 53, line wire 54, and ground wire 55 are each surrounded by an insulator 52. The LWS 24A includes a conductive foil 54B surrounding the insulated line wire 54, at least one copper strand wire 84 in electrical contact with the conductive foil 54B, and a conductive foil 91A surrounding the conductive foil 54B and the least one copper strand wire 84. Each of the conductive foils 54A and 91A include a conductive side and a non-conductive side, The at least one copper strand wire 84 is sandwiched between the conductive sides of conductive foils 54A and 91A. The NWS 24B includes a conductive foil 53B surrounding the insulated neutral wire 53, at least one copper strand wire 83 in electrical contact with the conductive foil 53B, and a conductive foil 91B surrounding the conductive foil 54B and the least one copper strand wire 83. Each of the conductive foils 53B and 91B include a conductive side and a non-conductive side, The at least one copper strand wire 83 is sandwiched between the conductive sides of conductive foils 3B and 91B.

It should be understood that the foregoing descriptions are only illustrative of the invention. It will be appreciated that the PCFC accomplishes leakage current detection and open shield detection. It will also be appreciated the PCFC does not include any discrete capacitors; thus, reducing the number of components and associated product production cycles. Thus, various alternatives and modifications can be devised by those skilled in the art without departing from the invention. For example, solid state devices SCR1 or Q1 can be any suitable solid-state device. Accordingly, the present invention is intended to embrace all such alternatives, modifications and variances that fall within the scope of the appended claims.

What is claimed is:

1. A Leakage Current Detection Interrupter (LCDI) circuit for interrupting AC power from an AC source connected to a load via an insulated neutral wire and an insulated line wire, the LCDI circuit comprising:
   the insulated neutral wire surrounded by a neutral wire shield (NWS);
   the insulated line wire surrounded by a line wire shield (LWS);
   wherein the neutral wire shield (NWS) and the line wire shield (LWS) each comprise:
   a wire shield, wherein the wire shield comprises:
   a conductive foil;
   a wire braid;
   an insulating film; and wherein the wire braid is sandwiched between the conductive foil and the insulating film;
a power supply circuit for supplying a rectified voltage waveform;
a floating load connected to the power supply circuit, wherein the floating load comprises:
a power cord fault circuit (PCFC) for monitoring the NWS and LWS integrity and leakage current, and
wherein the LCDI does not include any discrete capacitors.

2. The LCDI circuit as in claim 1 further comprising an accessory wire.

3. The LCDI circuit as in claim 1 wherein the neutral wire shield (NWS) and the line wire shield (LWS) each comprise:
a wire shield, wherein the wire shield comprises:
a first conductive foil, wherein the first conductive foil comprises a first conductive side and a first non-conductive side;
a wire braid;
a second conductive foil wherein the second conductive foil comprises a second conductive side and a second non-conductive side; and
wherein the wire braid is sandwiched between the conductive sides of the first conductive foil and the second conductive foil.

4. The LCDI circuit as in claim 1 wherein the neutral wire shield (NWS) and the line wire shield (LWS) each comprise:
a wire shield, wherein the wire shield comprises:
a conductive foil;
at least one copper strand wire;
an insulating film; and
wherein the at least one copper strand wire is sandwiched between the conductive foil and the insulating film.

5. The LCDI circuit as in claim 1 wherein the neutral wire shield (NWS) and the line wire shield (LWS) each comprise:
a wire shield, wherein the wire shield comprises:
a first conductive foil, wherein the first conductive foil comprises a first conductive side and a first non-conductive side;
at least one copper strand wire aid;
a second conductive foil wherein the second conductive foil comprises a second conductive side and a second non-conductive side; and
wherein the at least one copper strand wire is sandwiched between the conductive sides of the first conductive foil and the second conductive foil.

6. A Leakage Current Detection Interrupter (LCDI) circuit for interrupting AC power from an AC source connected to a load via an insulated neutral wire and an insulated line wire, the LCDI circuit comprising:
the insulated neutral wire surrounded by a neutral wire shield (NWS);
the insulated line wire surrounded by a line wire shield (LWS);
wherein the neutral wire shield (NWS) and the line wire shield (LWS) each comprise:
a wire shield, wherein the wire shield comprises:
a first conductive foil, wherein the first conductive foil comprises:
a first conductive side and a first non-conductive side;
a wire braid;
a second conductive foil wherein the second conductive foil comprises:
a second conductive side and a second non-conductive side; and
wherein the wire braid is sandwiched between the conductive sides of the first conductive foil and the second conductive foil;
a power supply circuit for supplying a rectified voltage waveform;
a floating load connected to the power supply circuit, wherein the floating load comprises:
a power cord fault circuit (PCFC) for monitoring the NWS and LWS integrity and leakage current; and
wherein the LCDI does not include any discrete capacitors.

7. A Leakage Current Detection Interrupter (LCDI) circuit for interrupting AC power from an AC source connected to a load via an insulated neutral wire and an insulated line wire, the LCDI circuit comprising:
the insulated neutral wire surrounded by a neutral wire shield (NWS);
the insulated line wire surrounded by a line wire shield (LWS);
wherein the neutral wire shield (NWS) and the line wire shield (LWS) each comprise:
a wire shield, wherein the wire shield comprises:
a first conductive foil, wherein the first conductive foil comprises:
a first conductive side and a first non-conductive side;
at least one copper strand wire aid;
a second conductive foil wherein the second conductive foil comprises:
a second conductive side and a second non-conductive side; and
wherein the at least one copper strand wire is sandwiched between the conductive sides of the first conductive foil and the second conductive foil;
a power supply circuit for supplying a rectified voltage waveform;
a floating load connected to the power supply circuit, wherein the floating load comprises:
a power cord fault circuit (PCFC) for monitoring the NWS and LWS integrity and leakage current; and
wherein the LCDI does not include any discrete capacitors.

8. A Leakage Current Detection Interrupter (LCDI) circuit for interrupting AC power from an AC source connected to a load via an insulated neutral wire and an insulated line wire, the LCDI circuit comprising:
the insulated neutral wire surrounded by a neutral wire shield (NWS);
the insulated line wire surrounded by a line wire shield (LWS);
wherein the neutral wire shield (NWS) and the line wire shield (LWS) each comprise:
a wire shield, wherein the wire shield comprises:
a conductive foil;
at least one copper strand wire;
an insulating film; and
wherein the at least one copper strand wire is sandwiched between the conductive foil and the insulating film;
a power supply circuit for supplying a rectified voltage waveform;
a floating load connected to the power supply circuit, wherein the floating load comprises:
a power cord fault circuit (PCFC) for monitoring the NWS and LWS integrity and leakage current; and
wherein the LCDI does not include any discrete capacitors.

\* \* \* \* \*